(12) United States Patent
Rurlaender et al.

(10) Patent No.: US 6,171,385 B1
(45) Date of Patent: Jan. 9, 2001

(54) ADHESIVE MIXTURE SUITABLE FOR MOUNTING AND DEMOUNTING A SEMICONDUCTOR WAFER

(75) Inventors: Robert Rurlaender, Halsbach; Norbert Franze, Burgkirchen; Franz Mangs, Tittmoning; Anton Schnegg, Burghausen, all of (DE)

(73) Assignee: Wacker Siltronic Gesellschaft für Halbleitermaterialien AG, Burghausen (DE)

( * ) Notice: Under 35 U.S.C. 154(b), the term of this patent shall be extended for 0 days.

(21) Appl. No.: 09/207,891

(22) Filed: Dec. 8, 1998

(30) Foreign Application Priority Data

Dec. 18, 1997 (DE) .............................. 197 56 614

(51) Int. Cl.⁷ .................. C09J 191/00; C09J 193/04; C09J 1/04
(52) U.S. Cl. .............. 106/659; 106/238; 106/500; 530/215; 530/221; 530/232
(58) Field of Search ................ 106/659, 147.1, 106/238, 500; 156/326; 530/215, 221, 231, 232

(56) References Cited

U.S. PATENT DOCUMENTS

| | | | |
|---|---|---|---|
| 4,283,242 | | 8/1981 | Regler et al. |
| 5,080,746 | * | 1/1992 | Sorg .................................. 156/307.3 |
| 5,342,873 | * | 8/1994 | Merz et al. ........................... 524/425 |
| 5,552,519 | * | 9/1996 | Hemmings et al. ................. 530/216 |

FOREIGN PATENT DOCUMENTS

| | | |
|---|---|---|
| 15 14 864 | 1/1970 | (DE) . |
| 3205734 A1 * | 8/1983 | (DE) . |
| 0601615 | 6/1994 | (EP) . |
| 2 384 589 | 10/1978 | (FR) . |

OTHER PUBLICATIONS

Derwent Abstract corr. to DE–A 1514864 (AN 1970–03246 R).

Patent Abstracts of Japan, vol. 098, No. 003, Feb. 27, 1998, & JP 09 286 967 A (The JNCTEC Inc.).

* cited by examiner

Primary Examiner—Mark Kopec
(74) Attorney, Agent, or Firm—Collard & Roe, P.C.

(57) ABSTRACT

A method of mounting and demounting a semiconductor wafer, in which a temperature dependent adhesive and curable joint is provided by an adhesive mixture between the semiconductor wafer and a carrier plate. The adhesive mixture contains a colophonium resin which is chemically modified and esterified. The cured joint is released with water again after polishing the semiconductor wafer. The adhesive mixture suitable for carrying out the method is this resin with an amine which saponifies the resin.

5 Claims, No Drawings

ADHESIVE MIXTURE SUITABLE FOR MOUNTING AND DEMOUNTING A SEMICONDUCTOR WAFER

BACKGROUND OF THE INVENTION

1. Field of the Invention

The present invention relates to a method of mounting and demounting a semiconductor wafer, in which a temperature dependent adhesive and a cured or curable joint are provided by an adhesive mixture located between the semiconductor wafer and a carrier plate. The adhesive mixture contains a colophonium resin which is chemically modified and esterified. The cured joint is released again after polishing the semiconductor wafer. In addition, the invention relates to a water-soluble adhesive mixture which is a temperature dependent adhesive which is cured in a dried state. The adhesive contains a colophonium resin which is chemically modified and esterified so as to be suitable for carrying out the method.

2. The Prior Art

To polish a front side of a semiconductor wafer, the semiconductor wafer is mounted by means of the rear side on a carrier plate. The joint between the semiconductor wafer and the carrier plate is provided by means of a thin layer of a temperature dependent adhesive and then curing the adhesive. Exceptional requirements have to be imposed on the adhesive for the polishing to be successful. The carrier plate must be capable of being uniformly coated with the adhesive. The adhesive action of the adhesive must be limited to a narrow temperature range. Under the polishing conditions, the adhesive must be a solid and remain solid so that the semiconductor wafer remains attached to the carrier plate. The use of the adhesive must not have an adverse effect on the shape of the polished semiconductor wafer. The surface of the polished semiconductor wafer must be as flat as possible. After polishing, the adhesive should be capable of being removed again from the carrier plate and from the semiconductor wafer without special effort. Finally, the adhesive should not give off any substances, in particular metal particles, which will contaminate the semiconductor wafer.

Colophonium resins and their derivatives are known for having a temperature dependent adhesive action. However, before now it has not yet been possible to create an adhesive based thereon which can completely fulfil the requirements mentioned above.

SUMMARY OF THE INVENTION

The present invention relates to a method for mounting and demounting a semiconductor wafer, in which a temperature dependent adhesive and a cured or curable joint are provided by an adhesive mixture located between the semiconductor wafer and a carrier plate. The adhesive mixture contains a colophonium resin which is chemically modified and esterified. The cured joint is released again after polishing the semiconductor wafer. The present invention also relates to a method comprising releasing the cured joint with water. In addition, the present invention relates to the adhesive mixture, which contains the colophonium resin plus an amine of the formula $NR^1R^2R^3$ which saponifies the colophonium resin, at least one of the radicals $R^1$, $R^2$ and $R^3$ being the radical of an aliphatic alcohol and the boiling point of the amine being higher than 150° C. at a pressure of 1000 mbar.

The advantages of the invention include the fact that no flammable solvents are required. Also no gases harmful to health are released during mixing and heating of the adhesive mixture. Also, expensive safety precautions directed to these solvent or harmful gas substances can be eliminated. In addition, the adhesive mixture can be converted into an adhesive state by heating to comparatively low temperatures and can be dissolved completely in water even in the cured state. Also, the method does not leave behind any corrugation in the submicrometer range ("waviness") on the surface of the polished semiconductor wafer.

The adhesive mixture contains chemically modified and esterified colophonium resin. The colophonium resin starting material is available commercially. For example, the colophonium resin is preferably obtained by vacuum distillation from crude tall oil. Particularly preferably, a doubly vacuum-distilled fraction of the crude tall oil having a narrow molecular weight distribution is used as an initial ingredient for preparing the adhesive final mixture. The colophonium resin ("tall oil resin") obtained in this way is chemically modified and esterified.

It is preferable that the colophonium resin is modified by reaction with an acid compound selected from a group comprising maleic acid, maleic acid anhydride and fumaric acid. The modified resin is then preferably esterified with an alcohol selected from a group comprising glycerol and pentaerythritol. The chemically modified and esterified colophonium resin should have an acid number from 50 to 250, preferably 100 to 140 [mg KOH/g resin] and a softening point of 60° C. to 180° C., preferably 90° C. to 140° C. Particularly preferred is a resin from Arizona Chemicals, Sweden, which is obtainable commercially under the trademark BERGVIK®—1XX, XX being a serial batch number, for example 00, 01 etc.

According to the invention, the modified and esterified colophonium resin is used to produce an adhesive mixture which contains this resin plus an amine of the formula $NR^1R^2R^3$. At least one of the radicals $R^1$, $R^2$ and $R^3$ is the radical of an aliphatic alcohol. Otherwise these radicals $R^1$, $R^2$ and $R^3$ are hydrogen. The boiling point of the amine is higher than 150° C. at a pressure of 1000 mbar. Triethanolamine is particularly preferable as the amine. Other examples of suitable amines include triisopropanolamine, diisopropanolamine and diethanolamine. The colophonium resin is saponified in the presence of the amine dissolved in water. As a result of this, the resin soap is a final product with adhesive properties that is water soluble and which will dissolve in the aqueous phase.

According to a particularly preferred formulation, the adhesive mixture has the following composition:

- 15% to 20% by weight of chemically modified and esterified colophonium resin;
- 5% to 10% by weight of triethanolamine;
- up to 2% by weight of a non-ionic surfactant, such as nonyl phenol polyether, which acts as a plasticizer;
- up to 10% by weight of an alcoholic solubilizer, such as isopropanol;
- up to 0.05% by weight of a dye, for example crystal violet, fluorescent dyestuffs such as rhodamine B and eosin, and intensely colored, water-soluble foodstuff dyes such as malachite green; and
- water in an amount making up the sum of the amounts specified to 100% by weight. In this formulation, all percents by weight are based upon the total weight of the composition.

The viscosity of the adhesive mixture has been adjusted so as to enable carrier plates to be coated homogeneously with the adhesive mixture. After coating, the adhesive mixture dries to form a temperature dependent adhesive and a curable mass. The adhesive action of the mass develops only within a narrow temperature range (adhesion zone, "sticking zone") of preferably 45° C. to 85° C. As in the case of a hot melt adhesive, the adhesive action decreases if the mass is heated above an upper temperature limit for the sticking zone. To produce a curable joint between a semiconductor wafer and the carrier plate, the carrier plate is heated to a temperature which is within the sticking zone, and one or more semiconductor wafers are placed on the carrier plate. When the carrier plate cools, the adhesive mixture cures and consequently provides a firm solid joint between the semiconductor wafer and the carrier plate. This joint remains firm and solid even under the temperature conditions of 30° C. to 50° C. normally prevailing during polishing. After the semiconductor wafer has been polished, the joint between the semiconductor wafer and the carrier plate is released again. This is done by exposure to water which preferably is at a temperature of 15° C. to 25° C. Water is capable of completely releasing by dissolving the residues of the adhesive mixture from the semiconductor wafer and from the carrier plate.

Other objects and features of the present invention will become apparent from the following detailed description considered in connection with the accompanying examples which disclose several embodiments of the present invention. It should be understood, however, that the examples are designed for the purpose of illustration only and not as a definition of the limits of the invention.

DETAILED DESCRIPTION OF PREFERRED EMBODIMENTS

EXAMPLE 1

While stirring at room temperature, 139.26 kg of deionized water, 14.74 kg of triethanolamine (80% by weight), 4.52 kg of nonyl phenol polyether, 19.64 kg of pure isopropanol and 0.1 kg of crystal violet were added in sequence to 35.74 kg of BERGVIK® M-106 resin. After the solids had dissolved, the mixture was filtered through a 5 μm bag filter and poured into canisters. The viscosity of the solution was 22 mm$^2$/s at 25° C. The sticking zone of the dried adhesive mixture was in a temperature range from 49° C. to 72° C.

EXAMPLE 2

While stirring at room temperature, 138.50 kg of deionized water, 14.4 kg of triethanolamine (80% by weight), 4.50 kg of nonyl phenol polyether, 19.7 kg of pure isopropanol and 0.1 kg of malachite green were added in sequence to 35.74 kg of BERGVIK®—106 resin. After the solids had dissolved, the mixture was filtered through a 5 μm bag filter and poured into canisters. The viscosity of the solution was 22 mm$^2$/s at 25° C. The sticking zone of the dried adhesive mixture was in a temperature range of 60° C. to 80° C.

EXAMPLE 3

While stirring at room temperature 276.50 kg of deionized water, 23.12 kg of triethanolamine (80% by weight), 8.42 kg of nonyl phenol polyether, 25 kg of pure isopropanol and 0.185 kg of rhodamine B were added in sequence to 66.28 kg of BERGVIK®—106 resin. After the solids had dissolved, the mixture was filtered through a 5 μm bag filter and poured into canisters. The viscosity of the solution was 22 mm$^2$/s at 25° C. The sticking zone of the dried adhesive mixture was in a temperature range of 66° C. to 79° C.

Accordingly, while a few embodiments of the present invention have been shown and described, it is to be understood that many changes and modifications may be made thereunto without departing from the spirit and scope of the invention as defined in the appended claims.

What is claimed is:

1. A water-soluble adhesive mixture which is a temperature dependent adhesive that cures in a dried state and comprises, a colophonium resin which is chemically modified and esterified; and an amine of the formula NR$^1$R$^2$R$^3$ which saponifies the colophonium resin, at least one of the radicals R$^1$, R$^2$ and R$^3$ being the radical of an aliphatic alcohol and the boiling point of the amine being higher than 150° C. at a pressure of 1000 mbar.

2. An adhesive mixture as claimed in claim 1, wherein the amine is selected from the group consisting of triethanolamine, triisopropanolamine, diisopropanolamine and diethanolamine.

3. An adhesive mixture as claimed in claim 1, wherein the colophonium resin is chemically modified by reaction with an acid compound selected from the group consisting of maleic acid, maleic anhydride and fumaric acid.

4. An adhesive mixture as claimed in claim 3, wherein the colophonium resin is esterified with an alcohol selected from the group consisting of glycerol and pentaerythritol.

5. An adhesive mixture as claimed in claim 1, which has the composition comprising from 15% to 20% by weight of chemically modified and esterified colophonium resin;

from 5% to 10% by weight of triethanolamine;

up to 2% by weight of non-ionic surfactant;

up to 10% by weight of alcoholic solubilizer;

up to 0.05% by weight of a dyestuff; and water in an amount making the sum of the amounts specified up to 100% by weight; and wherein each percent by weight is based upon the total weight of the composition.

* * * * *